United States Patent
Sorensen et al.

(10) Patent No.: US 9,478,212 B1
(45) Date of Patent: Oct. 25, 2016

(54) SYSTEMS AND METHODS FOR USE OF ADAPTIVE SECONDARY PATH ESTIMATE TO CONTROL EQUALIZATION IN AN AUDIO DEVICE

(71) Applicant: Cirrus Logic, Inc., Austin, TX (US)

(72) Inventors: Bryant E. Sorensen, Austin, TX (US);
Jon D. Hendrix, Wimberly, TX (US);
John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 127 days.

(21) Appl. No.: 14/476,471

(22) Filed: Sep. 3, 2014

(51) Int. Cl.
| | |
|---|---|
| *G10K 11/178* | (2006.01) |
| *H03G 5/16* | (2006.01) |
| *H04R 3/00* | (2006.01) |
| *H04R 1/10* | (2006.01) |
| *H04R 5/033* | (2006.01) |

(52) U.S. Cl.
CPC ......... *G10K 11/178* (2013.01); *G10K 11/1784* (2013.01); *H03G 5/165* (2013.01); *H04R 1/1083* (2013.01); *H04R 3/005* (2013.01); *G10K 2210/1081* (2013.01); *G10K 2210/3014* (2013.01); *G10K 2210/3026* (2013.01); *G10K 2210/3045* (2013.01); *H04R 5/033* (2013.01); *H04R 2410/05* (2013.01)

(58) Field of Classification Search
None
See application file for complete search history.

(56) References Cited

U.S. PATENT DOCUMENTS

| | | |
|---|---|---|
| 5,251,263 A | 10/1993 | Andrea et al. |
| 5,278,913 A | 1/1994 | Delfosse et al. |
| 5,321,759 A | 6/1994 | Yuan |
| 5,337,365 A | 8/1994 | Hamabe et al. |
| 5,359,662 A | 10/1994 | Yuan et al. |
| 5,410,605 A | 4/1995 | Sawada et al. |
| 5,425,105 A | 6/1995 | Lo et al. |
| 5,445,517 A | 8/1995 | Kondou et al. |
| 5,465,413 A | 11/1995 | Enge et al. |
| 5,481,615 A | 1/1996 | Eatwell et al. |
| 5,548,681 A | 8/1996 | Gleaves et al. |
| 5,559,893 A | 9/1996 | Krokstad |

(Continued)

FOREIGN PATENT DOCUMENTS

| | | |
|---|---|---|
| DE | 102011013343 A1 | 9/2012 |
| EP | 0412902 A2 | 2/1991 |

(Continued)

OTHER PUBLICATIONS

Parkins, et al., Narrowband and broadband active control in an enclosure using the acoustic energy density, J. Acoust. Soc. Am. Jul. 2000, pp. 192-203, vol. 108, issue 1, U.S.

(Continued)

*Primary Examiner* — Andrew L Sniezek
(74) *Attorney, Agent, or Firm* — Jackson Walker L.L.P.

(57) ABSTRACT

In accordance with embodiments of the present disclosure, an adjustable equalization filter may have a response that generates an equalized source audio signal from a source audio signal to account for effects of changes in an electro-acoustical path of the source audio signal to a transducer. An equalizer coefficient control block may adapt the response of the adjustable equalization filter in response to changes in a response of a secondary path estimate filter for modeling the electro-acoustical path of a source audio signal through the transducer, wherein a response of the secondary path estimate filter is adapted in conformity with an error microphone signal indicative of the acoustic output of the transducer.

30 Claims, 4 Drawing Sheets

(56) References Cited

U.S. PATENT DOCUMENTS

| | | |
|---|---|---|
| 5,586,190 A | 12/1996 | Trantow et al. |
| 5,640,450 A | 6/1997 | Watanabe |
| 5,668,747 A | 9/1997 | Ohashi |
| 5,696,831 A | 12/1997 | Inanaga |
| 5,699,437 A | 12/1997 | Finn |
| 5,706,344 A | 1/1998 | Finn |
| 5,740,256 A | 4/1998 | Castello Da Costa et al. |
| 5,768,124 A | 6/1998 | Stothers et al. |
| 5,815,582 A | 9/1998 | Claybaugh et al. |
| 5,832,095 A | 11/1998 | Daniels |
| 5,909,498 A | 6/1999 | Smith |
| 5,940,519 A | 8/1999 | Kuo |
| 5,946,391 A | 8/1999 | Dragwidge et al. |
| 5,991,418 A | 11/1999 | Kuo |
| 6,041,126 A | 3/2000 | Terai et al. |
| 6,118,878 A | 9/2000 | Jones |
| 6,219,427 B1 | 4/2001 | Kates et al. |
| 6,278,786 B1 | 8/2001 | McIntosh |
| 6,282,176 B1 | 8/2001 | Hemkumar |
| 6,418,228 B1 | 7/2002 | Terai et al. |
| 6,434,246 B1 | 8/2002 | Kates et al. |
| 6,434,247 B1 | 8/2002 | Kates et al. |
| 6,522,746 B1 | 2/2003 | Marchok et al. |
| 6,683,960 B1 | 1/2004 | Fujii et al. |
| 6,766,292 B1 | 7/2004 | Chandran et al. |
| 6,768,795 B2 | 7/2004 | Feltstrom et al. |
| 6,850,617 B1 | 2/2005 | Weigand |
| 6,940,982 B1 | 9/2005 | Watkins |
| 7,058,463 B1 | 6/2006 | Ruha et al. |
| 7,103,188 B1 | 9/2006 | Jones |
| 7,181,030 B2 | 2/2007 | Rasmussen et al. |
| 7,330,739 B2 | 2/2008 | Somayajula |
| 7,365,669 B1 | 4/2008 | Melanson |
| 7,466,838 B1 | 12/2008 | Moseley |
| 7,680,456 B2 | 3/2010 | Muhammad et al. |
| 7,742,790 B2 | 6/2010 | Konchitsky et al. |
| 7,817,808 B2 | 10/2010 | Konchitsky et al. |
| 7,885,417 B2 | 2/2011 | Christoph |
| 8,019,050 B2 | 9/2011 | Mactavish et al. |
| 8,249,262 B2 | 8/2012 | Chua et al. |
| 8,290,537 B2 | 10/2012 | Lee et al. |
| 8,325,934 B2 | 12/2012 | Kuo |
| 8,363,856 B2 | 1/2013 | Lesso et al. |
| 8,379,884 B2 | 2/2013 | Horibe et al. |
| 8,401,200 B2 | 3/2013 | Tiscareno et al. |
| 8,442,251 B2 | 5/2013 | Jensen et al. |
| 8,526,627 B2 | 9/2013 | Asao et al. |
| 8,804,974 B1 | 8/2014 | Melanson |
| 8,848,936 B2 | 9/2014 | Kwatra et al. |
| 8,907,829 B1 | 12/2014 | Naderi |
| 8,908,877 B2 | 12/2014 | Abdollahzadeh Milani et al. |
| 8,948,407 B2 | 2/2015 | Alderson et al. |
| 8,958,571 B2 | 2/2015 | Kwatra et al. |
| 9,066,176 B2 | 6/2015 | Hendrix et al. |
| 9,094,744 B1 | 7/2015 | Lu et al. |
| 9,106,989 B2 | 8/2015 | Li et al. |
| 9,107,010 B2 | 8/2015 | Abdollahzadeh Milani et al. |
| 9,264,808 B2 | 2/2016 | Zhou et al. |
| 9,294,836 B2 | 3/2016 | Zhou et al. |
| 2001/0053228 A1 | 12/2001 | Jones |
| 2002/0003887 A1 | 1/2002 | Zhang et al. |
| 2003/0063759 A1 | 4/2003 | Brennan et al. |
| 2003/0072439 A1 | 4/2003 | Gupta |
| 2003/0185403 A1 | 10/2003 | Sibbald |
| 2004/0047464 A1 | 3/2004 | Yu et al. |
| 2004/0120535 A1 | 6/2004 | Woods |
| 2004/0165736 A1 | 8/2004 | Hetherington et al. |
| 2004/0167777 A1 | 8/2004 | Hetherington et al. |
| 2004/0176955 A1 | 9/2004 | Farinelli, Jr. et al. |
| 2004/0196992 A1 | 10/2004 | Ryan |
| 2004/0202333 A1 | 10/2004 | Csermak et al. |
| 2004/0240677 A1 | 12/2004 | Onishi et al. |
| 2004/0242160 A1 | 12/2004 | Ichikawa et al. |
| 2004/0264706 A1 | 12/2004 | Ray et al. |
| 2005/0004796 A1 | 1/2005 | Trump et al. |
| 2005/0018862 A1 | 1/2005 | Fisher |
| 2005/0117754 A1 | 6/2005 | Sakawaki |
| 2005/0207585 A1 | 9/2005 | Christoph |
| 2005/0240401 A1 | 10/2005 | Ebenezer |
| 2006/0035593 A1 | 2/2006 | Leeds |
| 2006/0055910 A1 | 3/2006 | Lee |
| 2006/0069556 A1 | 3/2006 | Nadjar et al. |
| 2006/0109941 A1 | 5/2006 | Keele, Jr. |
| 2006/0153400 A1 | 7/2006 | Fujita et al. |
| 2007/0030989 A1 | 2/2007 | Kates |
| 2007/0033029 A1 | 2/2007 | Sakawaki |
| 2007/0038441 A1 | 2/2007 | Inoue et al. |
| 2007/0047742 A1 | 3/2007 | Taenzer et al. |
| 2007/0053524 A1 | 3/2007 | Haulick et al. |
| 2007/0076896 A1 | 4/2007 | Hosaka et al. |
| 2007/0154031 A1 | 7/2007 | Avendano et al. |
| 2007/0258597 A1 | 11/2007 | Rasmussen et al. |
| 2007/0297620 A1 | 12/2007 | Choy |
| 2008/0019548 A1 | 1/2008 | Avendano |
| 2008/0101589 A1 | 5/2008 | Horowitz et al. |
| 2008/0107281 A1 | 5/2008 | Togami et al. |
| 2008/0144853 A1 | 6/2008 | Sommerfeldt et al. |
| 2008/0166002 A1 | 7/2008 | Amsel |
| 2008/0177532 A1 | 7/2008 | Greiss et al. |
| 2008/0181422 A1 | 7/2008 | Christoph |
| 2008/0226098 A1 | 9/2008 | Haulick et al. |
| 2008/0240413 A1 | 10/2008 | Mohammad et al. |
| 2008/0240455 A1 | 10/2008 | Inoue et al. |
| 2008/0240457 A1 | 10/2008 | Inoue et al. |
| 2009/0012783 A1 | 1/2009 | Klein |
| 2009/0034748 A1 | 2/2009 | Sibbald |
| 2009/0041260 A1 | 2/2009 | Jorgensen et al. |
| 2009/0046867 A1 | 2/2009 | Clemow |
| 2009/0060222 A1 | 3/2009 | Jeong et al. |
| 2009/0080670 A1 | 3/2009 | Solbeck et al. |
| 2009/0086990 A1 | 4/2009 | Christoph |
| 2009/0136057 A1 | 5/2009 | Taenzer |
| 2009/0175466 A1 | 7/2009 | Elko et al. |
| 2009/0196429 A1 | 8/2009 | Ramakrishnan et al. |
| 2009/0220107 A1 | 9/2009 | Every et al. |
| 2009/0238369 A1 | 9/2009 | Ramakrishnan et al. |
| 2009/0245529 A1 | 10/2009 | Asada et al. |
| 2009/0254340 A1 | 10/2009 | Sun et al. |
| 2009/0290718 A1 | 11/2009 | Kahn et al. |
| 2009/0296965 A1 | 12/2009 | Kojima |
| 2009/0304200 A1 | 12/2009 | Kim et al. |
| 2009/0311979 A1 | 12/2009 | Husted et al. |
| 2010/0014683 A1 | 1/2010 | Maeda et al. |
| 2010/0014685 A1 | 1/2010 | Wurm |
| 2010/0061564 A1 | 3/2010 | Clemow et al. |
| 2010/0069114 A1 | 3/2010 | Lee et al. |
| 2010/0082339 A1 | 4/2010 | Konchitsky et al. |
| 2010/0098263 A1 | 4/2010 | Pan et al. |
| 2010/0098265 A1 | 4/2010 | Pan et al. |
| 2010/0124336 A1 | 5/2010 | Shridhar et al. |
| 2010/0124337 A1 | 5/2010 | Wertz et al. |
| 2010/0131269 A1 | 5/2010 | Park et al. |
| 2010/0142715 A1 | 6/2010 | Goldstein et al. |
| 2010/0150367 A1 | 6/2010 | Mizuno |
| 2010/0158330 A1 | 6/2010 | Guissin et al. |
| 2010/0166203 A1 | 7/2010 | Peissig et al. |
| 2010/0183175 A1 | 7/2010 | Chen et al. |
| 2010/0195838 A1 | 8/2010 | Bright |
| 2010/0195844 A1 | 8/2010 | Christoph et al. |
| 2010/0207317 A1 | 8/2010 | Iwami et al. |
| 2010/0246855 A1 | 9/2010 | Chen |
| 2010/0266137 A1 | 10/2010 | Sibbald et al. |
| 2010/0272276 A1 | 10/2010 | Carreras et al. |
| 2010/0272283 A1 | 10/2010 | Carreras et al. |
| 2010/0272284 A1 | 10/2010 | Joho et al. |
| 2010/0274564 A1 | 10/2010 | Bakalos et al. |
| 2010/0284546 A1 | 11/2010 | DeBrunner et al. |
| 2010/0291891 A1 | 11/2010 | Ridgers et al. |
| 2010/0296666 A1 | 11/2010 | Lin |
| 2010/0296668 A1 | 11/2010 | Lee et al. |
| 2010/0310086 A1 | 12/2010 | Magrath et al. |
| 2010/0310087 A1 | 12/2010 | Ishida |
| 2010/0316225 A1 | 12/2010 | Saito et al. |
| 2010/0322430 A1 | 12/2010 | Isberg |

(56) References Cited

U.S. PATENT DOCUMENTS

| | | |
|---|---|---|
| 2011/0002468 A1 | 1/2011 | Tanghe |
| 2011/0007907 A1 | 1/2011 | Park et al. |
| 2011/0026724 A1 | 2/2011 | Doclo |
| 2011/0096933 A1 | 4/2011 | Eastty |
| 2011/0106533 A1 | 5/2011 | Yu |
| 2011/0116643 A1 | 5/2011 | Tiscareno |
| 2011/0129098 A1 | 6/2011 | Delano et al. |
| 2011/0130176 A1 | 6/2011 | Magrath et al. |
| 2011/0142247 A1 | 6/2011 | Fellers et al. |
| 2011/0144984 A1 | 6/2011 | Konchitsky |
| 2011/0150257 A1 | 6/2011 | Jensen |
| 2011/0158419 A1 | 6/2011 | Theverapperuma et al. |
| 2011/0206214 A1 | 8/2011 | Christoph et al. |
| 2011/0222698 A1 | 9/2011 | Asao et al. |
| 2011/0222701 A1 | 9/2011 | Donaldson et al. |
| 2011/0249826 A1 | 10/2011 | Van Leest |
| 2011/0288860 A1 | 11/2011 | Schevciw et al. |
| 2011/0293103 A1 | 12/2011 | Park et al. |
| 2011/0299695 A1 | 12/2011 | Nicholson |
| 2011/0305347 A1 | 12/2011 | Wurm |
| 2011/0317848 A1 | 12/2011 | Ivanov et al. |
| 2012/0057720 A1 | 3/2012 | Van Leest |
| 2012/0084080 A1 | 4/2012 | Konchitsky et al. |
| 2012/0135787 A1 | 5/2012 | Kusunoki et al. |
| 2012/0140917 A1 | 6/2012 | Nicholson et al. |
| 2012/0140942 A1 | 6/2012 | Loeda |
| 2012/0140943 A1 | 6/2012 | Hendrix et al. |
| 2012/0148062 A1 | 6/2012 | Scarlett et al. |
| 2012/0155666 A1 | 6/2012 | Nair |
| 2012/0170766 A1 | 7/2012 | Alves et al. |
| 2012/0185524 A1 | 7/2012 | Clark |
| 2012/0207317 A1 | 8/2012 | Abdollahzadeh Milani et al. |
| 2012/0215519 A1 | 8/2012 | Park et al. |
| 2012/0250873 A1 | 10/2012 | Bakalos et al. |
| 2012/0259626 A1 | 10/2012 | Li et al. |
| 2012/0263317 A1 | 10/2012 | Shin et al. |
| 2012/0281850 A1 | 11/2012 | Hyatt |
| 2012/0300958 A1 | 11/2012 | Klemmensen |
| 2012/0300960 A1 | 11/2012 | Mackay et al. |
| 2012/0308021 A1 | 12/2012 | Kwatra et al. |
| 2012/0308024 A1 | 12/2012 | Alderson et al. |
| 2012/0308025 A1 | 12/2012 | Hendrix et al. |
| 2012/0308026 A1 | 12/2012 | Kamath et al. |
| 2012/0308027 A1 | 12/2012 | Kwatra |
| 2012/0308028 A1 | 12/2012 | Kwatra et al. |
| 2012/0310640 A1 | 12/2012 | Kwatra et al. |
| 2012/0316872 A1* | 12/2012 | Stoltz .............. G10L 21/0216 704/233 |
| 2013/0010982 A1 | 1/2013 | Elko et al. |
| 2013/0083939 A1 | 4/2013 | Fellers et al. |
| 2013/0156238 A1 | 6/2013 | Birch et al. |
| 2013/0222516 A1 | 8/2013 | Do et al. |
| 2013/0243198 A1 | 9/2013 | Van Rumpt |
| 2013/0243225 A1 | 9/2013 | Yokota |
| 2013/0259251 A1 | 10/2013 | Bakalos |
| 2013/0272539 A1 | 10/2013 | Kim et al. |
| 2013/0287218 A1 | 10/2013 | Alderson et al. |
| 2013/0287219 A1 | 10/2013 | Hendrix et al. |
| 2013/0301842 A1 | 11/2013 | Hendrix et al. |
| 2013/0301846 A1 | 11/2013 | Alderson et al. |
| 2013/0301847 A1 | 11/2013 | Alderson et al. |
| 2013/0301848 A1 | 11/2013 | Zhou et al. |
| 2013/0301849 A1 | 11/2013 | Alderson |
| 2013/0315403 A1 | 11/2013 | Samuelsson |
| 2013/0343556 A1 | 12/2013 | Bright |
| 2013/0343571 A1 | 12/2013 | Rayala et al. |
| 2014/0036127 A1 | 2/2014 | Pong et al. |
| 2014/0044275 A1 | 2/2014 | Goldstein et al. |
| 2014/0050332 A1 | 2/2014 | Nielsen et al. |
| 2014/0051483 A1 | 2/2014 | Schoerkmaier |
| 2014/0072134 A1 | 3/2014 | Po et al. |
| 2014/0072135 A1 | 3/2014 | Bajic et al. |
| 2014/0086425 A1 | 3/2014 | Jensen et al. |
| 2014/0126735 A1 | 5/2014 | Gauger, Jr. |
| 2014/0169579 A1 | 6/2014 | Azmi |
| 2014/0177851 A1 | 6/2014 | Kitazawa et al. |
| 2014/0177890 A1 | 6/2014 | Hojlund et al. |
| 2014/0211953 A1 | 7/2014 | Alderson et al. |
| 2014/0226827 A1 | 8/2014 | Abdollahzadeh Milani |
| 2014/0270222 A1 | 9/2014 | Hendrix et al. |
| 2014/0270223 A1 | 9/2014 | Li et al. |
| 2014/0270224 A1 | 9/2014 | Zhou et al. |
| 2014/0294182 A1 | 10/2014 | Axelsson |
| 2014/0307887 A1 | 10/2014 | Alderson |
| 2014/0307888 A1 | 10/2014 | Alderson et al. |
| 2014/0307890 A1 | 10/2014 | Zhou et al. |
| 2014/0307899 A1 | 10/2014 | Hendrix et al. |
| 2014/0314244 A1 | 10/2014 | Yong et al. |
| 2014/0314246 A1 | 10/2014 | Hellmann |
| 2014/0314247 A1 | 10/2014 | Zhang |
| 2014/0341388 A1* | 11/2014 | Goldstein ............ H04R 1/1083 381/71.11 |
| 2014/0369517 A1 | 12/2014 | Zhou et al. |
| 2015/0078572 A1 | 3/2015 | Milani et al. |
| 2015/0092953 A1 | 4/2015 | Abdollahzadeh Milani et al. |
| 2015/0104032 A1 | 4/2015 | Kwatra et al. |
| 2015/0161980 A1 | 6/2015 | Alderson et al. |
| 2015/0161981 A1 | 6/2015 | Kwatra |
| 2015/0163592 A1 | 6/2015 | Alderson |
| 2015/0256660 A1 | 9/2015 | Kaller et al. |
| 2015/0256953 A1 | 9/2015 | Kwatra et al. |
| 2015/0269926 A1 | 9/2015 | Alderson et al. |
| 2015/0365761 A1 | 12/2015 | Alderson |

FOREIGN PATENT DOCUMENTS

| | | |
|---|---|---|
| EP | 1691577 A2 | 8/2006 |
| EP | 1880699 A2 | 1/2008 |
| EP | 1947642 A1 | 7/2008 |
| EP | 2133866 A1 | 12/2009 |
| EP | 2237573 A1 | 10/2010 |
| EP | 2216774 A1 | 8/2011 |
| EP | 2395500 A1 | 12/2011 |
| EP | 2395501 A1 | 12/2011 |
| EP | 2551845 A1 | 1/2013 |
| EP | 2583074 A1 | 4/2013 |
| EP | 2984648 A2 | 2/2016 |
| EP | 2987160 A1 | 2/2016 |
| EP | 2987162 A1 | 2/2016 |
| EP | 2987337 A1 | 2/2016 |
| GB | 2401744 A | 11/2004 |
| GB | 2436657 A | 10/2007 |
| GB | 2455821 A | 6/2009 |
| GB | 2455824 A | 6/2009 |
| GB | 2455828 A | 6/2009 |
| GB | 2484722 A | 4/2012 |
| JP | H06186985 A | 7/1994 |
| JP | 07325588 A | 12/1995 |
| JP | 2006217542 A | 8/2006 |
| WO | 9911045 | 3/1999 |
| WO | 03015074 A1 | 2/2003 |
| WO | 03015275 A1 | 2/2003 |
| WO | WO2004009007 A1 | 1/2004 |
| WO | 04017303 A1 | 2/2004 |
| WO | 2004017303 A1 | 2/2004 |
| WO | 2006128768 A1 | 12/2006 |
| WO | 2007007916 A1 | 1/2007 |
| WO | 2007011337 A1 | 1/2007 |
| WO | 2007110807 A2 | 10/2007 |
| WO | 2007113487 A1 | 11/2007 |
| WO | 2010117714 A1 | 10/2010 |
| WO | 2011035061 A1 | 3/2011 |
| WO | 2012107561 A1 | 8/2012 |
| WO | 2012119808 A2 | 9/2012 |
| WO | 2012134874 A1 | 10/2012 |
| WO | 2012166273 A2 | 12/2012 |
| WO | 2012166388 A2 | 12/2012 |
| WO | 2014158475 A1 | 10/2014 |
| WO | 2014168685 A1 | 10/2014 |
| WO | 2014172005 A1 | 10/2014 |
| WO | 2014172006 A1 | 10/2014 |
| WO | 2014172010 A1 | 10/2014 |
| WO | 2014172019 A1 | 10/2014 |
| WO | 2014172021 A1 | 10/2014 |

(56) References Cited

FOREIGN PATENT DOCUMENTS

| WO | 2014200787 A1 | 12/2014 |
|---|---|---|
| WO | 2015038255 A1 | 3/2015 |
| WO | 2015088639 A | 6/2015 |
| WO | 2015088651 A1 | 6/2015 |
| WO | 2015088653 A1 | 6/2015 |
| WO | 2015134225 A1 | 9/2015 |
| WO | 2015191691 A1 | 12/2015 |

OTHER PUBLICATIONS

International Patent Application No. PCT/US2015/022113, International Search Report and Written Opinion, Jul. 23, 2015, 13 pages.
Ray, Laura et al., Hybrid Feedforward-Feedback Active Noise Reduction for Hearing Protection and Communication, The Journal of the Acoustical Society of America, American Institute of Physics for the Acoustical Society of America, New York, NY, vol. 120, No. 4, Jan. 2006, pp. 2026-2036.
International Patent Application No. PCT/US2014/017112, International Search Report and Written Opinion, May 8, 2015, 22 pages.
International Search Report and Written Opinion of the International Searching Authority, International Patent Application No. PCT/US2014/017343, mailed Aug. 8, 2014, 22 pages.
International Search Report and Written Opinion of the International Searching Authority, International Patent Application No. PCT/US2014/018027, mailed Sep. 4, 2014, 14 pages.
International Search Report and Written Opinion of the International Searching Authority, International Patent Application No. PCT/US2014/017374, mailed Sep. 8, 2014, 13 pages.
International Search Report and Written Opinion of the International Searching Authority, International Patent Application No. PCT/US2014/019395, mailed Sep. 9, 2014, 14 pages.
International Search Report and Written Opinion of the International Searching Authority, International Patent Application No. PCT/US2014/019469, mailed Sep. 12, 2014, 13 pages.
Feng, Jinwei et al., "A broadband self-tuning active noise equaliser", Signal Processing, Elsevier Science Publishers B.V. Amsterdam, NL, vol. 62, No. 2, Oct. 1, 1997, pp. 251-256.
Zhang, Ming et al., "A Robust Online Secondary Path Modeling Method with Auxiliary Noise Power Scheduling Strategy and Norm Constraint Manipulation", IEEE Transactions on Speech and Audio Processing, IEEE Service Center, New York, NY, vol. 11, No. 1, Jan. 1, 2003.
Lopez-Gaudana, Edgar et al., "A hybrid active noise cancelling with secondary path modeling", 51st Midwest Symposium on Circuits and Systems, 2008, MWSCAS 2008, Aug. 10, 2008, pp. 277-280.
Kou, Sen and Tsai, Jianming, Residual noise shaping technique for active noise control systems, J. Acoust. Soc. Am. 95 (3), Mar. 1994, pp. 1665-1668.
Pfann, et al., "LMS Adaptive Filtering with Delta-Sigma Modulated Input Signals," IEEE Signal Processing Letters, Apr. 1998, pp. 95-97, vol. 5, No. 4, IEEE Press, Piscataway, NJ.
Toochinda, et al., "A Single-Input Two-Output Feedback Formulation for ANC Problems," Proceedings of the 2001 American Control Conference, Jun. 2001, pp. 923-928, vol. 2, Arlington, VA.
Kuo, et al., "Active Noise Control: A Tutorial Review," Proceedings of the IEEE, Jun. 1999, pp. 943-973, vol. 87, No. 6, IEEE Press, Piscataway, NJ.
Johns, et al., "Continuous-Time LMS Adaptive Recursive Filters," IEEE Transactions on Circuits and Systems, Jul. 1991, pp. 769-778, vol. 38, No. 7, IEEE Press, Piscataway, NJ.
Shoval, et al., "Comparison of DC Offset Effects in Four LMS Adaptive Algorithms," IEEE Transactions on Circuits and Systems II: Analog and Digital Processing, Mar. 1995, pp. 176-185, vol. 42, Issue 3, IEEE Press, Piscataway, NJ.
Mali, Dilip, "Comparison of DC Offset Effects on LMB Algorithm and its Derivatives," International Journal of Recent Trends in Engineering, May 2009, pp. 323-328, vol. 1, No. 1, Academy Publisher.

Kates, James M., "Principles of Digital Dynamic Range Compression," Trends in Amplification, Spring 2005, pp. 45-76, vol. 9, No. 2, Sage Publications.
Gao, et al., "Adaptive Linearization of a Loudspeaker," IEEE International Conference on Acoustics, Speech, and Signal Processing, Apr. 14-17, 1991, pp. 3589-3592, Toronto, Ontario, CA.
Silva, et al., "Convex Combination of Adaptive Filters With Different Tracking Capabilities," IEEE International Conference on Acoustics, Speech, and Signal Processing, Apr. 15-20, 2007, pp. III 925-928, vol. 3, Honolulu, HI, USA.
Akhtar, et al., "A Method for Online Secondary Path Modeling in Active Noise Control Systems," IEEE International Symposium on Circuits and Systems, May 23-26, 2005, pp. 264-267, vol. 1, Kobe, Japan.
Davari, et al., "A New Online Secondary Path Modeling Method for Feedforward Active Noise Control Systems," IEEE International Conference on Industrial Technology, Apr. 21-24, 2008, pp. 1-6, Chengdu, China.
Lan, et al., "An Active Noise Control System Using Online Secondary Path Modeling With Reduced Auxiliary Noise," IEEE Signal Processing Letters, Jan. 2002, pp. 16-18, vol. 9, Issue 1, IEEE Press, Piscataway, NJ.
Liu, et al., "Analysis of Online Secondary Path Modeling With Auxiliary Noise Scaled by Residual Noise Signal," IEEE Transactions on Audio, Speech and Language Processing, Nov. 2010, pp. 1978-1993, vol. 18, Issue 8, IEEE Press, Piscataway, NJ.
Booji, P.S., Berkhoff, A.P., Virtual sensors for local, three dimensional, broadband multiple-channel active noise control and the effects on the quiet zones, Proceedings of ISMA2010 including USD2010, pp. 151-166.
Lopez-Caudana, Edgar Omar, Active Noise Cancellation: The Unwanted Signal and the Hybrid Solution, Adaptive Filtering Applications, Dr. Lino Garcia, ISBN: 978-953-307-306-4, InTech.
D. Senderowicz et al., "Low-Voltage Double-Sampled Delta-Sigma Converters," IEEE J. Solid-State Circuits, vol. 32,, No. 12, pp. 1907-1919, Dec. 1997, 13 pages.
Hurst, P.J. and Dyer, K.C., "An improved double sampling scheme for switched-capacitor delta-sigma modulators," IEEE Int. Symp. Circuits Systems, May 1992, vol. 3, pp. 1179-1182, 4 pages.
Milani, et al., "On Maximum Achievable Noise Reduction in ANC Systems", Proceedings of the IEEE International Conference on Acoustics, Speech, and Signal Processing, ICASSP 2010, Mar. 14-19, 2010 pp. 349-352.
Ryan, et al., "Optimum near-field performance of microphone arrays subject to a far-field beampattern constraint", 2248 J. Acoust. Soc. Am. 108, Nov. 2000.
Cohen, et al., "Noise Estimation by Minima Controlled Recursive Averaging for Robust Speech Enhancement", IEEE Signal Processing Letters, vol. 9, No. 1, Jan. 2002.
Martin, "Noise Power Spectral Density Estimation Based on Optimal Smoothing and Minimum Statistics", IEEE Trans. on Speech and Audio Processing, col. 9, No. 5, Jul. 2001.
Martin, "Spectral Subtraction Based on Minimum Statistics", Proc. 7th EUSIPCO '94, Edinburgh, U.K., Sep. 13-16, 1994, pp. 1182-1195.
Cohen, "Noise Spectrum Estimation in Adverse Environments: Improved Minima Controlled Recursive Averaging", IEEE Trans. on Speech & Audio Proc., vol. 11, Issue 5, Sep. 2003.
Black, John W., "An Application of Side-Tone in Subjective Tests of Microphones and Headsets", Project Report No. NM 001 064.01.20, Research Report of the U.S. Naval School of Aviation Medicine, Feb. 1, 1954, 12 pages (pp. 1-12 in pdf), Pensacola, FL, US.
Lane, et al., "Voice Level: Autophonic Scale, Perceived Loudness, and the Effects of Sidetone", The Journal of the Acoustical Society of America, Feb. 1961, pp. 160-167, vol. 33, No. 2., Cambridge, MA, US.
Liu, et al., "Compensatory Responses to Loudness-shifted Voice Feedback During Production of Mandarin Speech", Journal of the Acoustical Society of America, Oct. 2007, pp. 2405-2412, vol. 122, No. 4
Paepcke, et al., "Yelling in the Hall: Using Sidetone to Address a Problem with Mobile Remote Presence Systems", Symposium on

(56) References Cited

OTHER PUBLICATIONS

User Interface Software and Technology, Oct. 16-19, 2011, 10 pages (pp. 1-10 in pdf), Santa Barbara, CA, US
Peters, Robert W., "The Effect of High-Pass and Low-Pass Filtering of Side-Tone Upon Speaker Intelligibility", Project Report No. NM 001 064.01.25, Research Report of the U.S. Naval School of Aviation Medicine, Aug. 16, 1954, 13 pages (pp. 1-13 in pdf), Pensacola, FL, US.
Therrien, et al., "Sensory Attenuation of Self-Produced Feedback: The Lombard Effect Revisited", PLOS ONE, Nov. 2012, pp. 1-7, vol. 7, Issue 11, e49370, Ontario, Canada.
Campbell, Mikey, "Apple looking into self-adjusting earbud headphones with noise cancellation tech", Apple Insider, Jul. 4, 2013, pp. 1-10 (10 pages in pdf), downloaded on May 14, 2014 from http://appleinsider.com/articles/13/07/04/apple-looking-into-self-adjusting-earbud-headphones-with-noise-cancellation-tech.
International Patent Application No. PCT/US2014/017096, International Search Report and Written Opinion, May 27, 2014, 11 pages.
Jin, et al., "A simultaneous equation method-based online secondary path modeling algorithm for active noise control", Journal of Sound and Vibration, Apr. 25, 2007, pp. 455-474, vol. 303, No. 3-5, London, GB.
Erkelens et al., "Tracking of Nonstationary Noise Based on Data-Driven Recursive Noise Power Estimation", IEEE Transactions on Audio Speech, and Language Processing, vol. 16, No. 6, Aug. 2008.
Rao et al., "A Novel Two Stage Single Channle Speech Enhancement Technique", India Conference (Indicon) 2011 Annual IEEE, IEEE, Dec. 15, 2011.
Rangachari et al., "A noise-estimation algorithm for highly nonstationary environments" Speech Communication, Elsevier Science Publishers, vol. 48, No. 2, Feb. 1, 2006.
Widrow, B. et al., Adaptive Noise Cancelling: Principles and Applications, Proceedings of the IEEE, IEEE, New York, NY, U.S., vol. 63, No. 13, Dec. 1975, pp. 1692-1716.
Morgan, Dennis R. et al., A Delayless Subband Adaptive Filter Architecture, IEEE Transactions on Signal Processing, IEEE Service Center, New York, NY, U.S., vol. 43, No. 8, Aug. 1995, pp. 1819-1829.
International Patent Application No. PCT/US2014/040999, International Search Report and Written Opinion, Oct. 18, 2014, 12 pages.
International Patent Application No. PCT/US2013/049407, International Search Report and Written Opinion, Jun. 18, 2014, 13 pages.
International Patent Application No. PCT/US2015/017124, International Search Report and Written Opinion, Jul. 13, 2015, 19 pages.
International Patent Application No. PCT/US2015/035073, International Search Report and Written Opinion, Oct. 8, 2015, 11 pages.
International Patent Application No. PCT/US2014/049600, International Search Report and Written Opinion, Jan. 14, 2015, 12 pages.
International Patent Application No. PCT/US2014/061753, International Search Report and Written Opinion, Feb. 9, 2015, 8 pages.
International Patent Application No. PCT/US2014/061548, International Search Report and Written Opinion, Feb. 12, 2015, 13 pages.
International Patent Application No. PCT/US2014/060277, International Search Report and Written Opinion, Mar. 9, 2015, 11 pages.
Combined Search and Examination Report, Application No. GB1512832.5, mailed Jan. 28, 2016, 7 pages.
International Patent Application No. PCT/US2015/066260, International Search Report and Written Opinion, Apr. 21, 2016, 13 pages.
English machine translation of JP 2006-217542 A (Okumura, Hiroshi; Howling Suppression Device and Loudspeaker, published Aug. 2006).
combined Search and Examination Report, Application No. GB1519000.2, mailed Apr. 21, 2016, 5 pages.

* cited by examiner

SYSTEMS AND METHODS FOR USE OF ADAPTIVE SECONDARY PATH ESTIMATE TO CONTROL EQUALIZATION IN AN AUDIO DEVICE

FIELD OF DISCLOSURE

The present disclosure relates in general to providing for adaptive playback equalization in an audio device.

BACKGROUND

Personal audio devices, such as mobile/cellular telephones, cordless telephones, and other consumer audio devices, such as mp3 players, are in widespread use. Performance of such devices with respect to intelligibility can be improved by providing noise canceling using a microphone to measure ambient acoustic events and then using signal processing to insert an anti-noise signal into the output of the device to cancel the ambient acoustic events. Because the acoustic environment around personal audio devices such as wireless telephones can change dramatically, depending on the sources of noise that are present and the position of the device itself, it is desirable to adapt the noise canceling to take into account such environmental changes.

Some personal audio devices also include equalizers. Equalizers typically attempt to apply to a source audio signal an inverse of a response of the electro-acoustical path of the source audio signal through the transducer, in order to reduce the effects of the electro-acoustical path. In most traditional approaches, equalization is performed with a static equalizer. However, an adaptive equalizer may provide better output sound quality than a static equalizer, and thus, may be desirable in many applications.

SUMMARY

In accordance with the teachings of the present disclosure, the disadvantages and problems associated with improving audio performance of a personal audio device may be reduced or eliminated.

In accordance with embodiments of the present disclosure, a personal audio device may include a personal audio device housing, a transducer, an error microphone, and a processing circuit. The transducer may be coupled to the housing and may be configured to reproduce an output audio signal including an equalized source audio signal for playback to a listener. The error microphone may be coupled to the housing in proximity to the transducer and may be configured to provide an error microphone signal indicative of the acoustic output of the transducer. The processing circuit may implement a secondary path estimate filter for modeling an electro-acoustical path of a source audio signal through the transducer, a secondary path estimate filter coefficient control block that shapes a response of the secondary path estimate filter in conformity with the error microphone signal, an adjustable equalization filter having a response that generates the equalized source audio signal from the source audio signal to account for effects of changes in an electro-acoustical path of the source audio signal, and an equalizer coefficient control block that adapts the response of the adjustable equalization filter in response to changes in the response of the secondary path estimate filter.

In accordance with these and other embodiments of the present disclosure, a method may include receiving an error microphone signal indicative of an acoustic output of a transducer. The method may also include modeling an electro-acoustical path of a source audio signal with a secondary path estimate filter. The method may further include adapting the response of the secondary path estimate filter in conformity with the error microphone signal. The method may additionally include generating an equalized source audio signal from a source audio signal by filtering the source audio signal with an adjustable equalization filter to account for effects of changes in an electro-acoustical path of the source audio signal. The method may also include adapting the response of the adjustable equalization filter in response to changes in the response of the secondary path estimate filter.

In accordance with these and other embodiments of the present disclosure, an integrated circuit may comprise an output, an error microphone input, and a processing circuit. The output may be configured to provide a signal to a transducer including an equalized source audio signal for playback. The error microphone input may be configured to receive an error microphone signal indicative of the acoustic output of the transducer. The processing circuit may implement a secondary path estimate filter for modeling an electro-acoustical path of a source audio signal through the transducer, a secondary path estimate filter coefficient control block that shapes a response of the secondary path estimate filter in conformity with the error microphone signal, an adjustable equalization filter having a response that generates the equalized source audio signal from the source audio signal to account for effects of changes in an electro-acoustical path of the source audio signal, and an equalizer coefficient control block that adapts the response of the adjustable equalization filter in response to changes in the response of the secondary path estimate filter.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1A:
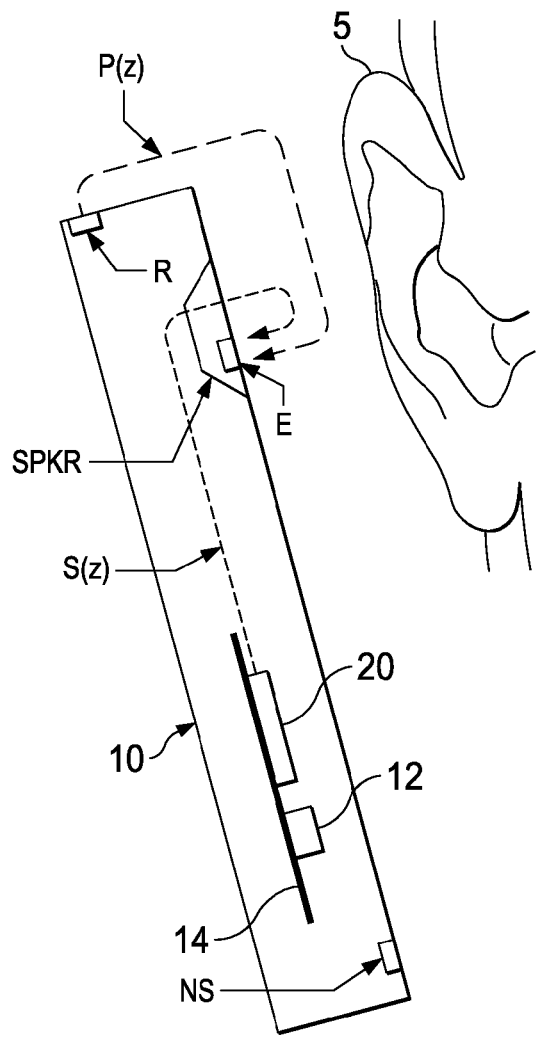
FIG. 1A is an illustration of an example personal audio device, in accordance with embodiments of the present disclosure.

Referring now to FIG. 1A, a personal audio device 10 as illustrated in accordance with embodiments of the present disclosure is shown in proximity to a human ear 5. Personal audio device 10 is an example of a device in which techniques in accordance with embodiments of the invention may be employed, but it is understood that not all of the elements or configurations embodied in illustrated personal audio device 10, or in the circuits depicted in subsequent illustrations, are required in order to practice the invention recited in the claims. Personal audio device 10 may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. A near-speech microphone NS may be provided to capture near-end speech, which is transmitted from personal audio device 10 to the other conversation participant(s).

Personal audio device 10 may include adaptive noise cancellation (ANC) circuits and features that inject an anti-noise signal into speaker SPKR to improve intelligibility of the distant speech and other audio reproduced by speaker SPKR. A reference microphone R may be provided for measuring the ambient acoustic environment, and may be positioned away from the typical position of a user's mouth, so that the near-end speech may be minimized in the signal produced by reference microphone R. Another microphone, error microphone E, may be provided in order to further improve the ANC operation by providing a measure of the ambient audio combined with the audio reproduced by speaker SPKR close to ear 5, when personal audio device 10 is in close proximity to ear 5. Circuit 14 within personal audio device 10 may include an audio CODEC integrated circuit (IC) 20 that receives the signals from reference microphone R, near-speech microphone NS, and error microphone E, and interfaces with other integrated circuits such as a radio-frequency (RF) integrated circuit 12 having a wireless telephone transceiver. In some embodiments of the disclosure, the circuits and techniques disclosed herein may be incorporated in a single integrated circuit that includes control circuits and other functionality for implementing the entirety of the personal audio device, such as an MP3 player-on-a-chip integrated circuit. In these and other embodiments, the circuits and techniques disclosed herein may be implemented partially or fully in software and/or firmware embodied in computer-readable media and executable by a controller or other processing device.

In general, ANC techniques of the present disclosure measure ambient acoustic events (as opposed to the output of speaker SPKR and/or the near-end speech) impinging on reference microphone R, and by also measuring the same ambient acoustic events impinging on error microphone E, ANC processing circuits of personal audio device 10 adapt an anti-noise signal generated out of the output of speaker SPKR from the output of reference microphone R to have a characteristic that minimizes the amplitude of the ambient acoustic events at error microphone E. Because acoustic path P(z) extends from reference microphone R to error microphone E, ANC circuits are effectively estimating acoustic path P(z) while removing effects of an electro-acoustical path S(z) that represents the response of the audio output circuits of CODEC IC 20 and the acoustic/electric transfer function of speaker SPKR including the coupling between speaker SPKR and error microphone E in the particular acoustic environment, which may be affected by the proximity and structure of ear 5 and other physical objects and human head structures that may be in proximity to personal audio device 10, when personal audio device 10 is not firmly pressed to ear 5. While the illustrated personal audio device 10 includes a two-microphone ANC system with a third near-speech microphone NS, some aspects of the present invention may be practiced in a system that does not include separate error and reference microphones, or a wireless telephone that uses near-speech microphone NS to perform the function of the reference microphone R. Also, in personal audio devices designed only for audio playback, near-speech microphone NS will generally not be included, and the near-speech signal paths in the circuits described in further detail below may be omitted, without changing the scope of the disclosure, other than to limit the options provided for input to the microphone covering detection schemes. In addition, although only one reference microphone R is depicted in FIG. 1, the circuits and techniques herein disclosed may be adapted, without changing the scope of the disclosure, to personal audio devices including a plurality of reference microphones.

Figure 1B:
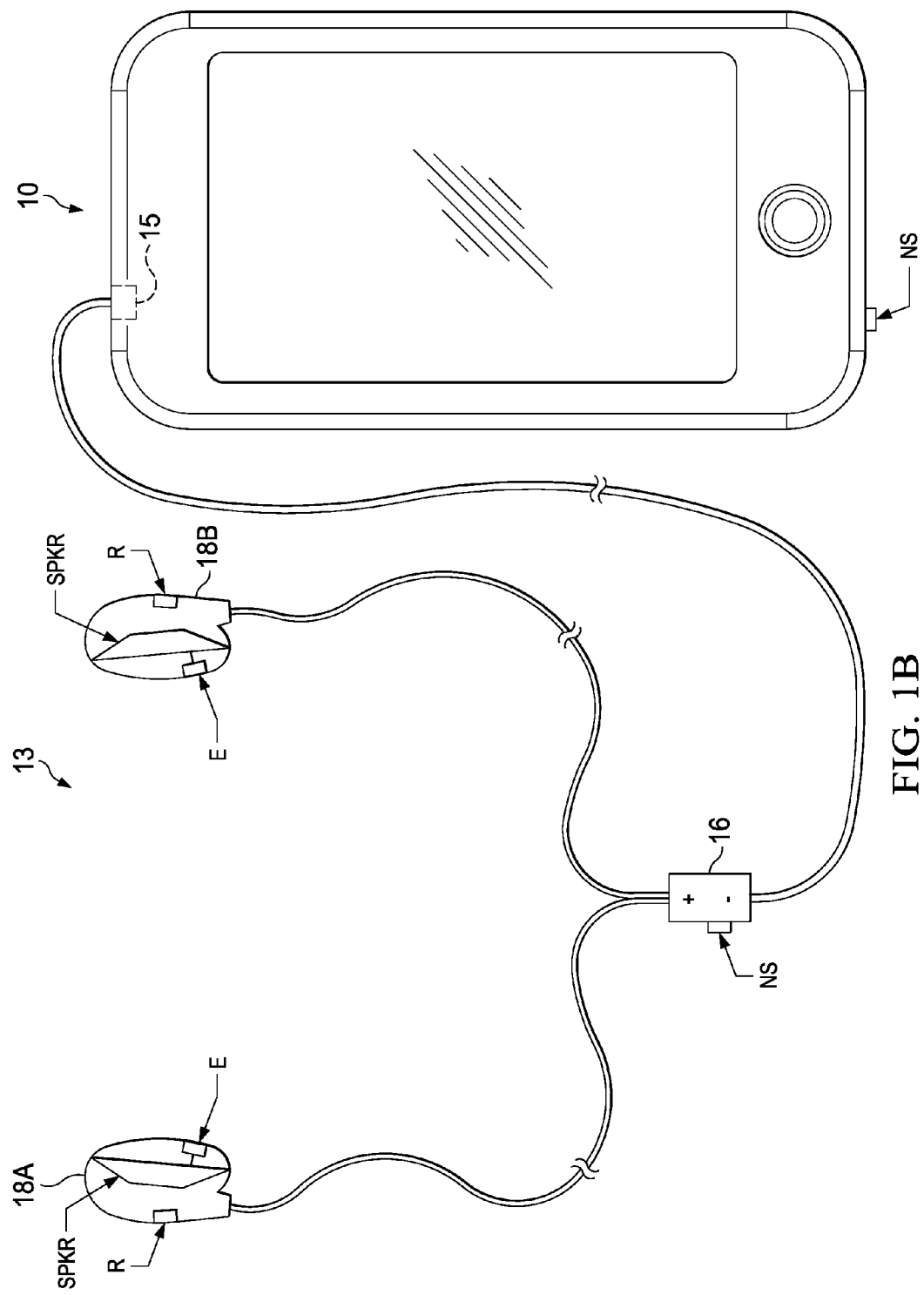
FIG. 1B is an illustration of an example personal audio device with a headphone assembly coupled thereto, in accordance with embodiments of the present disclosure.

Referring now to FIG. 1B, personal audio device 10 is depicted having a headphone assembly 13 coupled to it via audio port 15. Audio port 15 may be communicatively coupled to RF integrated circuit 12 and/or CODEC IC 20, thus permitting communication between components of headphone assembly 13 and one or more of RF integrated circuit 12 and/or CODEC IC 20. As shown in FIG. 1B, headphone assembly 13 may include a combox 16, a left headphone 18A, and a right headphone 18B. As used in this disclosure, the term "headphone" broadly includes any loudspeaker and structure associated therewith that is intended to be mechanically held in place proximate to a listener's ear or ear canal, and includes without limitation earphones, earbuds, and other similar devices. As more specific non-limiting examples, "headphone," may refer to intra-canal earphones, intra-concha earphones, supra-concha earphones, and supra-aural earphones.

Combox 16 or another portion of headphone assembly 13 may have a near-speech microphone NS to capture near-end speech in addition to or in lieu of near-speech microphone NS of personal audio device 10. In addition, each headphone 18A, 18B may include a transducer such as speaker SPKR that reproduces distant speech received by personal audio device 10, along with other local audio events such as ringtones, stored audio program material, injection of near-end speech (i.e., the speech of the user of personal audio device 10) to provide a balanced conversational perception, and other audio that requires reproduction by personal audio device 10, such as sources from webpages or other network communications received by personal audio device 10 and audio indications such as a low battery indication and other system event notifications. Each headphone 18A, 18B may include a reference microphone R for measuring the ambient acoustic environment and an error microphone E for measuring of the ambient audio combined with the audio reproduced by speaker SPKR close to a listener's ear when such headphone 18A, 18B is engaged with the listener's ear. In some embodiments, CODEC IC 20 may receive the signals from reference microphone R, near-speech microphone NS, and error microphone E of each headphone and perform adaptive noise cancellation for each headphone as described herein. In other embodiments, a CODEC IC 20 or another circuit may be present within headphone assembly 13, communicatively coupled to reference microphone R, near-speech microphone NS, and error microphone E, and configured to perform adaptive noise cancellation as described herein.

The various microphones referenced in this disclosure, including reference microphones, error microphones, and near-speech microphones, may comprise any system, device, or apparatus configured to convert sound incident at such microphone to an electrical signal that may be processed by a controller, and may include without limitation an electrostatic microphone, a condenser microphone, an electret microphone, an analog microelectromechanical systems (MEMS) microphone, a digital MEMS microphone, a piezoelectric microphone, a piezo-ceramic microphone, or a dynamic microphone.

Figure 2:
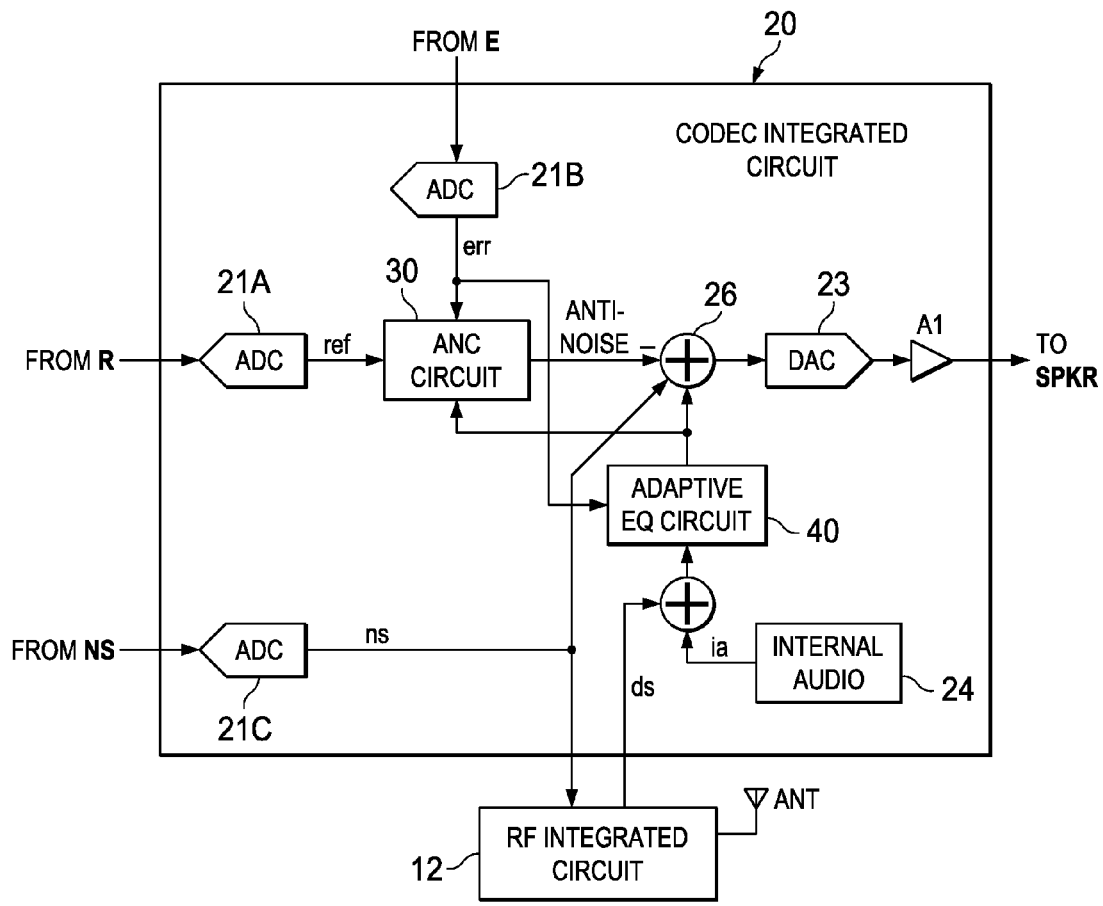
FIG. 2 is a block diagram of selected circuits within the personal audio device depicted in FIG. 1, in accordance with embodiments of the present disclosure.

Referring now to FIG. 2, selected circuits within personal audio device 10, which in other embodiments may be placed in whole or part in other locations, such as one or more headphone assemblies 13, are shown in a block diagram. CODEC IC 20 may include an analog-to-digital converter (ADC) 21A for receiving the reference microphone signal and generating a digital representation ref of the reference microphone signal, an ADC 21B for receiving the error microphone signal and generating a digital representation err of the error microphone signal, and an ADC 21C for receiving the near speech microphone signal and generating a digital representation ns of the near speech microphone signal. CODEC IC 20 may generate an output for driving speaker SPKR from an amplifier A1, which may amplify the output of a digital-to-analog converter (DAC) 23 that receives the output of a combiner 26. Combiner 26 may combine an equalized source audio signal generated by adaptive equalization circuit 40 from audio signals is from internal audio sources 24 and/or downlink speech ds which may be received from radio frequency (RF) integrated circuit 12, the anti-noise signal generated by ANC circuit 30, which by convention has the same polarity as the noise in reference microphone signal ref and is therefore subtracted by combiner 26, and a portion of near speech microphone signal ns so that the user of personal audio device 10 may hear his or her own voice in proper relation to downlink speech ds. Near speech microphone signal ns may also be provided to RF integrated circuit 12 and may be transmitted as uplink speech to the service provider via antenna ANT.

Figure 3:
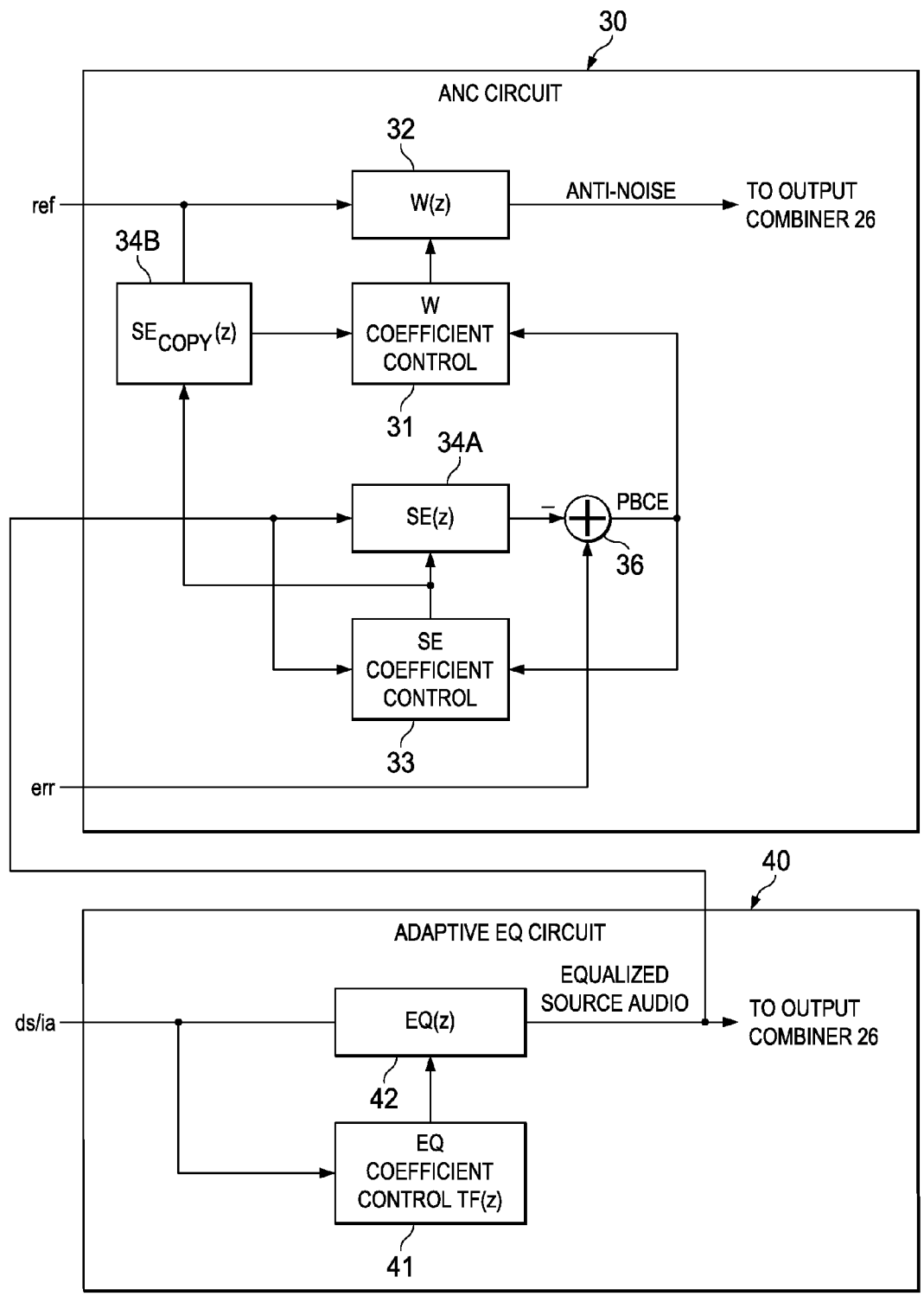
FIG. 3 is a block diagram depicting selected signal processing circuits and functional blocks within an example active noise canceling (ANC) circuit and an adaptive equalization circuit of a coder-decoder (CODEC) integrated circuit of FIG. 3, in accordance with embodiments of the present disclosure.

Referring now to FIG. 3, details of ANC circuit 30 and adaptive equalization circuit 40 are shown in accordance with embodiments of the present disclosure. With respect to ANC circuit 30, adaptive filter 32 may receive reference microphone signal ref and under ideal circumstances, may adapt its transfer function W(z) to approximate P(z)/S(z) to generate the anti-noise signal, which may be provided to an output combiner that combines the anti-noise signal with the audio to be reproduced by the transducer, as exemplified by combiner 26 of FIG. 2. The coefficients of adaptive filter 32 may be controlled by a W coefficient control block 31 that uses a correlation of signals to determine the response of adaptive filter 32, which generally minimizes the error, in a least-mean squares sense, between those components of reference microphone signal ref present in error microphone signal err. The signals compared by W coefficient control block 31 may be the reference microphone signal ref as shaped by a copy of a response SE(z) estimating the response of path S(z) provided by filter 34B and a playback corrected error, labeled as "PBCE" in FIG. 3, based at least in part on error microphone signal err. The response SE(z) and playback corrected error may be generated as described in greater detail below.

By transforming reference microphone signal ref with a copy of the estimate of the response of path S(z), response $SE_{COPY}(z)$ of filter 34B, and minimizing the difference between the resultant signal and error microphone signal err, adaptive filter 32 may adapt to the desired response of P(z)/S(z). In addition to error microphone signal err, the signal compared to the output of filter 34B by W coefficient control block 31 may include an inverted amount of equalized source audio signal (e.g., downlink audio signal ds and/or internal audio signal ia), that has been processed by filter response SE(z), of which response $SE_{COPY}(z)$ is a copy. By injecting an inverted amount of equalized source audio signal, adaptive filter 32 may be prevented from adapting to the relatively large amount of equalized source audio signal present in error microphone signal err. However, by transforming that inverted copy of equalized source audio signal with the estimate of the response of path S(z), the equalized source audio that is removed from error microphone signal err should match the expected version of the equalized source audio signal reproduced at error microphone signal err, because the electrical and acoustical path of S(z) is the path taken by the equalized source audio signal to arrive at error microphone E. Filter 34B may not be an adaptive filter, per se, but may have an adjustable response that is tuned to match the response of adaptive filter 34A, so that the response of filter 34B tracks the adapting of adaptive filter 34A.

To implement the above, adaptive filter 34A may have coefficients controlled by SE coefficient control block 33, which may compare the equalized source audio signal and a playback corrected error. The playback corrected error may be equal to error microphone signal err after removal of the equalized source audio signal (as filtered by filter 34A to represent the expected playback audio delivered to error microphone E) by a combiner 36. SE coefficient control block 33 may correlate the actual equalized source audio signal with the components of the equalized source audio signal that are present in error microphone signal err. Adaptive filter 34A may thereby be adapted to generate a secondary estimate signal from the equalized source audio signal, that when subtracted from error microphone signal err to generate the playback corrected error, includes the content of error microphone signal err that is not due to the equalized source audio signal.

Although FIGS. 2 and 3 depict a feedforward ANC system in which an anti-noise signal is generated from a filtered reference microphone signal, any other suitable ANC system employing an error microphone may be used in connection with the methods and systems disclosed herein. For example, in some embodiments, an ANC circuit employing feedback ANC, in which anti-noise is generated from a playback corrected error signal, may be used instead of or in addition to feedforward ANC, as depicted in FIGS. 2 and 3.

With respect to adaptive equalizer circuit 40, adjustable equalization filter 42 may receive the source audio signal (e.g., downlink speech ds and/or internal audio ia) and may adapt its transfer function EQ(z) in conformity with a target filter of response TF(z) to generate the equalized source audio signal, which may be provided to ANC circuit 30 (as described above) and provided to an output combiner that combines the anti-noise signal with the equalized source audio signal to be reproduced by the transducer, as exemplified by combiner 26 of FIG. 2. The coefficients of adjustable equalization filter 42 may be controlled by an equalizer coefficient control block 41 configured to shape the response EQ(z) of adjustable equalization filter 42 in conformity with a response TF(z) of a target filter by adapting the response EQ(z) of the adjustable equalization filter to minimize a difference between the response TF(z) of the target filter and the response EQ(z) of the adjustable equalization filter. The response TF(z) of the target filter may be a function of the response SE(z) of adaptive filter 34A.

For example, in some embodiments, the response TF(z) of the target filter may be equal to the ratio of an ideal response SF(z) of the electro-acoustical path to the response SE(z) of secondary path estimate filter 34A. The response SF(z), which may be based on laboratory or production measurements or characterizations, may be a representation of an ideal or desired transfer function to be accomplished by the actual response S(z) of the electro-acoustical path. Thus, the response SF(z) seeks to preserve desirable acoustic properties which are audible to a listener. However, because response S(z) may change over time or change based on environmental or other factors (e.g., placement of a transducer in relation to a listener's ear), response S(z) may differ from the desired response SF(z). As the actual response S(z) changes, so too does response SE(z) of secondary path estimate filter 34A. Accordingly, transfer function EQ(z) of adjustable equalization filter 42, by adapting towards a response TF(z) of a target filter which is a function of response SE(z) of secondary path estimate filter 34A, may serve as a correction filter which may undo the effects of a changing response S(z) so that the path of the source audio signal more closely approximates the desired response SF(z). To illustrate, a transfer function Y(z) of a source audio signal PB(z) through speaker SPKR may be given as:

$$Y(z)=PB(z) \cdot S(z) \approx PB(z) \cdot SE(z)$$

However, the ideal transfer function of the source audio signal PB(z) through speaker SPKR may be given as:

$$Y_{ideal}(z)=PB(z) \cdot SF(z)$$

The difference between the desired transfer function $Y_{ideal}(z)$ and the actual transfer function Y(z) may be expressed as a ratio of the two in the z-domain. This difference becomes the response TF(z) of the target filter implemented by coefficient control block 41:

$$TF(z)=SF(z)/SE(z) \approx SF(z)/S(z)=Y_{ideal}(z)/Y(z)$$

If this difference, the response TF(z), is applied to the source audio signal, then the desired response SF(z) to be applied to the source audio signal is approximated:

$$Y_{actual}(z)=PB(z) \cdot TF(z) \cdot S(z)=PB(z) \cdot (SF(z)/SE(z)) \cdot S(z)$$
$$\approx PB(z) \cdot SF(z)$$

In some embodiments, adjustable equalization filter 42 may be applied to the source audio signal at the same sampling rate as the source audio signal (e.g., the baseband rate). However, response TF(z) may be computed at a slower rate, such that when response TF(z) is updated, it may differ significantly from the response EQ(z). Accordingly, it may be desirable to adapt response EQ(z) towards response TF(z) in a manner which smoothly converges response EQ(z) towards response TF(z) in order to avoid creating audio artifacts which may be audible to a listener. Such smooth convergence may be accomplished in any suitable manner.

For example, in some embodiments, a "cross-fade" mechanism may be used to accomplish such smooth convergence. In such embodiments, the source audio signal may be filtered by each of adjustable equalization filter 42 and the target filter implemented by coefficient control block 41 to generate outputs $X_{EQ}(z)=EQ(z) \cdot PB(z)$ and $X_{TF}(z)=TF(z) \cdot PB(z)$, respectively. The outputs may then be individually weighted and summed to provide the equalized source audio signal $X(z)=\lambda \cdot X_{TF}(z)+(1-\lambda) \cdot X_{EQ}(z)$. To cross-fade, the value of λ may be dynamically and gradually ramped from 0 to 1, so that equalized source audio signal X(z) is initially the value of $X_{EQ}(z)$ at λ=0, and transitions towards $X_{EQ}(z)$ at λ=1. Response EQ(z) of adjustable equalization filter 42 may then be made equal to response TF(z), the target filter, and its response TF(z) may again be updated based on response SE(z), and the cross-fade applied again.

Figure 4:
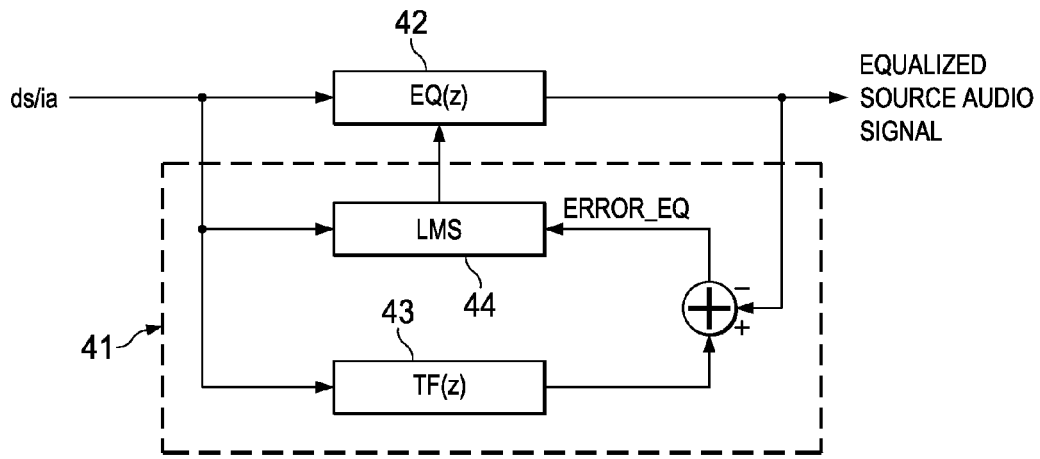
FIG. 4 is a block diagram depicting least-mean-squares adaptation of an adjustable equalization filter, in accordance with embodiments of the present disclosure.

As another example, in these and other embodiments, least-mean-squares (LMS) techniques may be applied to drive adaptation of response EQ(z) towards response TF(z), as shown in FIG. 4. As shown in FIG. 4, coefficients of adjustable equalization filter 42 may be controlled by an LMS control block 44 that may shape the response EQ(z) of adjustable equalization filter 42 in conformity with the source audio signal and an equalization error ERROR_EQ equal to the difference between the source audio signal as filtered by response TF(z) of filter 43 and the equalized source audio signal, by adapting coefficients of adjustable equalization filter 42 to minimize equalization error ERROR_EQ.

Figure 5:
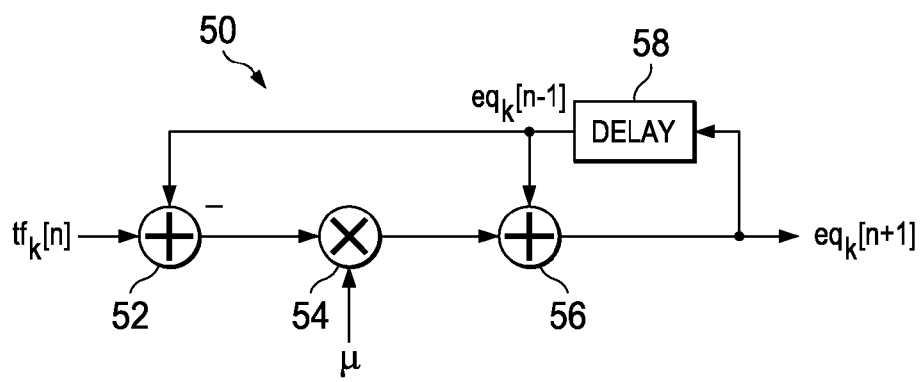
FIG. 5 illustrates a block diagram depicting a method for exponential smoothing of a single coefficient for an adjustable equalization filter, in accordance with embodiments of the present disclosure.

LMS control block 44 may apply at least one of exponential smoothing and linear interpolation to perform such adaptation. In some embodiments, the LMS control block 44 may update all coefficients of adjustable equalization filter 42 for each sample of the source audio signal. In other embodiments, processing requirements of adaptive equalization circuit 40 may be minimized by LMS control block 44 updating only one coefficient of adjustable equalization filter 42 for each sample of the source audio signal. FIG. 5 illustrates a block diagram 50 depicting a method for exponential smoothing of a single coefficient for adjustable equalization filter 42, in accordance with embodiments of the present disclosure. As shown in FIG. 5, in the discrete-time domain where a discrete time is given by n, a coefficient $eq_k[n]$ for adjustable equalization filter 42 may be subtracted from a coefficient $tf_k[n]$ for filter 43 by a combiner 52. The result may be multiplied by a constant μ at multiplier 54. The constant μ may be a user-adjustable constant which may control or define a rate of adaptation of a coefficient. The result from multiplier 54 may be added to coefficient $eq_k[n]$ at combiner 56, resulting in the coefficient $eq_k[n+1]$ of the next time step. The coefficient $eq_k[n+1]$ may be delayed by delay block 58 by a discrete time step before being fed back to combiners 52 and 56. Accordingly, the value of a coefficient of adjustable equalization filter 42 in embodiments in which each coefficient is updated at each discrete time interval n may be given by the equation:

$$eq_k[n+1]=\mu(tf_k[n]-eq_k[n])+eq_k[n]$$

where k may have a value between 0 and M−1, where M is the number of coefficients of adjustable equalization filter 42. On the other hand, in embodiments in which a single coefficient is updated for each discrete time interval n may be given by:

$$eq_{n \% M}[n+1]=\mu(tf_{n \% M}[n]-eq_{n \% M}[n])+eq_{n \% M}[n]$$

where M is the number of coefficients of adjustable equalization filter 42 and % is the modulo operator.

In addition to the equalization functionality described above, adaptive equalization circuit 40 may perform other functions. For example, in some embodiments, adaptive equalization circuit 40 may perform frequency emphasis allowing for gain or attenuation of certain frequencies. In some of these embodiments, gain emphasis may be fixed by incorporating frequency emphasis into the ideal response SF(z). In other of these embodiments, adaptive equalization circuit 40 may implement frequency emphasis via fixed filters after the application of response EQ(z) to the source audio signal. Frequency emphasis may additionally or alternatively be incorporated into response TF(z), wherein frequency-emphasis shaped signals change the ratio SF(z)/SE(z).

As another example, in these and other embodiments, adaptive equalization circuit 40 may perform psychoacoustic signal processing (e.g., virtual bass) in conjunction with equalization. Such psychoacoustic signal processing may be performed prior to or after application of adjustable equalization filter 42, or may be incorporated into the equalization performed by adjustable equalization filter 42.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A personal audio device, comprising:
   a personal audio device housing;
   a transducer coupled to the housing for reproducing an output audio signal including an equalized source audio signal for playback to a listener;
   an error microphone coupled to the housing in proximity to the transducer for providing an error microphone signal indicative of an acoustic output of the transducer;
   a processing circuit that implements:
   a secondary path estimate filter for modeling an electro-acoustical path of a source audio signal through the transducer;
   a secondary path estimate filter coefficient control block that shapes a response of the secondary path estimate filter in conformity with the error microphone signal;
   an adjustable equalization filter having a response that generates an equalized source audio signal from the source audio signal to account for effects of changes in the electro-acoustical path of the source audio signal; and
   an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter; wherein:
   the target filter has a response equal to a ratio of a response of a fixed ideal filter to the response of the secondary path estimate filter; and
   the response of the fixed ideal filter is a pre-calculated transfer function desired to be applied by the electro-acoustical path.

2. The personal audio device of claim 1, wherein the processing circuit further implements a mixer for outputting a blended equalized source audio signal, wherein the blended equalized source audio signal is cross-faded between the source audio signal as filtered by the target filter and the source audio signal as filtered by the adjustable equalization filter.

3. The personal audio device of claim 1, wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

4. The personal audio device of claim 3, wherein the least-mean-squares adaptation technique comprises updating one coefficient of the adjustable equalization filter for each sample of the source audio signal by applying at least one of exponential smoothing and linear interpolation.

5. The personal audio device of claim 3, wherein the least-mean-squares adaptation technique comprises updating all coefficients of the adjustable equalization filter for each sample of the source audio signal by applying at least one of exponential smoothing and linear interpolation.

6. The personal audio device of claim 1, wherein:
   the error microphone signal is indicative of the acoustic output of the transducer and ambient audio sounds at the transducer; and
   the processing circuit is further configured to implement a noise cancellation system that generates an anti-noise signal to reduce the presence of the ambient audio sounds heard by the listener based at least on the error microphone signal.

7. The personal audio device of claim 1, wherein the response of the adjustable equalization filter further applies frequency emphasis to the source audio signal.

8. The personal audio device of claim 1, wherein the response of the adjustable equalization filter further applies psychoacoustic enhancement to the source audio signal.

9. The personal audio device of claim 1, wherein the response of the secondary path estimate filter generates a secondary path estimate from the equalized source audio signal.

10. The personal audio device of claim 1, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

11. A method comprising:
receiving an error microphone signal indicative of an acoustic output of a transducer;
modeling an electro-acoustical path of a source audio signal with a secondary path estimate filter;
adapting a response of the secondary path estimate filter in conformity with the error microphone signal;
generating an equalized source audio signal from a source audio signal by filtering the source audio signal with an adjustable equalization filter to account for effects of changes in the electro-acoustical path of the source audio signal; and
adapting a response of the adjustable equalization filter in response to changes in the response of the secondary path estimate filter to minimize a difference between the response of the target filter and the response of the adjustable equalization filter; wherein:
the target filter has a response equal to a ratio of a response of a fixed ideal filter to the response of the secondary path estimate filter; and
the response of the fixed ideal filter is a pre-calculated transfer function desired to be applied by the electro-acoustical path.

12. The method of claim 11, further comprising outputting a blended equalized source audio signal, wherein the blended equalized source audio signal is cross-faded between the source audio signal as filtered by the target filter and the source audio signal as filtered by the adjustable equalization filter.

13. The method of claim 11, further comprising adapting the response of the adjustable equalization filter to minimize a difference between the source audio signal as filtered by the target filter and the source audio signal as filtered by adjustable equalization filter using a least-mean-squares adaptation technique.

14. The method of claim 13, wherein the least-mean-squares adaptation technique comprises updating one coefficient of the adjustable equalization filter for each sample of the source audio signal by applying at least one of exponential smoothing and linear interpolation.

15. The method of claim 13, wherein the least-mean-squares adaptation technique comprises updating all coefficients of the adjustable equalization filter for each sample of the source audio signal by applying at least one of exponential smoothing and linear interpolation.

16. The method of claim 11, wherein the error microphone signal is indicative of the acoustic output of the transducer and ambient audio sounds at the transducer, and the method further comprises generating an anti-noise signal to reduce the presence of the ambient audio sounds heard by a listener of the transducer based at least on the error microphone signal.

17. The method of claim 11, further comprising applying frequency emphasis to the source audio signal.

18. The method of claim 11, further comprises applying psychoacoustic enhancement to the source audio signal.

19. The method of claim 11, further comprising generating a secondary path estimate from the equalized source audio signal with the secondary path estimate filter.

20. The method of claim 11, wherein adapting the response of the adjustable equalization filter comprises shaping a response of the secondary path estimate filter in conformity with the equalized source audio signal and a playback corrected error by adapting the response of the secondary path estimate filter to minimize the playback corrected error, wherein the playback corrected error is based on a difference between the error microphone signal and the secondary path estimate.

21. An integrated circuit comprising:
an output for providing a signal to a transducer including an equalized source audio signal for playback;
an error microphone input for receiving an error microphone signal indicative of an acoustic output of the transducer; and
a processing circuit that implements:
a secondary path estimate filter for modeling an electro-acoustical path of a source audio signal through the transducer;
a secondary path estimate filter coefficient control block that shapes a response of the secondary path estimate filter in conformity with the error microphone signal;
an adjustable equalization filter having a response that generates the equalized source audio signal from the source audio signal to account for effects of changes in the electro-acoustical path of the source audio signal; and
an equalizer coefficient control block that adapts the response of the adjustable equalization filter in response to changes in the response of the secondary path estimate filter to shape the response of the adjustable equalization filter in conformity with a response of a target filter by adapting the response of the adjustable equalization filter to minimize a difference between the response of the target filter and the response of the adjustable equalization filter; wherein:
the target filter has a response equal to a ratio of a response of a fixed ideal filter to the response of the secondary path estimate filter; and
the response of the fixed ideal filter is a pre-calculated transfer function desired to be applied by the electro-acoustical path.

22. The integrated circuit of claim 21, wherein the processing circuit further implements a mixer for outputting a blended equalized source audio signal, wherein the blended equalized source audio signal is cross-faded between the source audio signal as filtered by the target filter and the source audio signal as filtered by the adjustable equalization filter.

23. The integrated circuit of claim 21, wherein the equalizer coefficient control block is configured to shape the response of the adjustable equalization filter in conformity with the response of the target filter by adapting the response of the adjustable equalization filter to minimize a difference between the source audio signal as filtered by the target filter and the source audio signal as filtered by the adjustable equalization filter using a least-mean-squares adaptation technique.

24. The integrated circuit of claim 23, wherein the least-mean-squares adaptation technique comprises updating one coefficient of the adjustable equalization filter for each sample of the source audio signal by applying at least one of exponential smoothing and linear interpolation.

25. The integrated circuit of claim 23, wherein the least-mean-squares adaptation technique comprises updating all coefficients of the adjustable equalization filter for each sample of the source audio signal by applying at least one of exponential smoothing and linear interpolation.

26. The integrated circuit of claim 21, wherein:
the error microphone signal is indicative of the acoustic output of the transducer and ambient audio sounds at the transducer; and
the processing circuit is further configured to implement a noise cancellation system that generates an anti-noise signal to reduce the presence of the ambient audio sounds heard by a listener of the transducer based at least on the error microphone signal.

27. The integrated circuit of claim 21, wherein the response of the adjustable equalization filter further applies frequency emphasis to the source audio signal.

28. The integrated circuit of claim 21, wherein the response of the adjustable equalization filter further applies psychoacoustic enhancement to the source audio signal.

29. The integrated circuit of claim 21, wherein the response of the secondary path estimate filter generates a secondary path estimate from the equalized source audio signal.

30. The integrated circuit of claim 21, wherein the secondary path estimate filter coefficient control block shapes a response of the secondary path estimate filter in conformity with the equalized source audio signal and a playback corrected error by adapting the response of the secondary path estimate filter to minimize the playback corrected error, wherein the playback corrected error is based on a difference between the error microphone signal and a secondary path estimate generated by filtering the equalized source audio signal with the secondary path estimate filter.

* * * * *